United States Patent [19]
Hirose et al.

[11] Patent Number: 5,990,005
[45] Date of Patent: Nov. 23, 1999

[54] METHOD OF BURYING A CONTACT HOLE WITH A METAL FOR FORMING MULTILEVEL INTERCONNECTIONS

[75] Inventors: Kazuyuki Hirose; Kuniko Miyakawa, both of Tokyo, Japan

[73] Assignee: NEC Corporation, Tokyo, Japan

[21] Appl. No.: 08/799,037

[22] Filed: Feb. 10, 1997

[51] Int. Cl.$^6$ .................................................. H01L 21/443
[52] U.S. Cl. .......................... 438/660; 438/663; 438/688; 438/687; 438/645
[58] Field of Search ..................................... 438/660, 662, 438/663, 688, 687, 645

[56] References Cited

U.S. PATENT DOCUMENTS 5,814,556  9/1998  Wee et al. ................................ 438/620

FOREIGN PATENT DOCUMENTS 63-128730  6/1988  Japan .
1-268126  10/1989  Japan .

*Primary Examiner*—Caridad Everhart
*Attorney, Agent, or Firm*—Young & Thompson

[57] ABSTRACT

A method of burying a conductive metal into a contact hole formed in an insulation film formed over a silicon substrate. Within the contact hole a refractory metal silicide layer has been formed on the silicon substrate and a barrier metal layer has been formed on the refractory metal silicide layer and further a conductive metal film has been formed on the barrier metal layer. A top surface region of the conductive metal film is rapidly heated to a first temperature below a melting point of the conductive metal film and high enough so as to cause a semi-fluidization of only the top surface region of the conductive metal film so as to maintain an interface between the barrier metal layer and the conductive metal film at a second temperature which is lower than the first temperature and low enough so as to prevent any chemical reaction between the barrier metal layer and the conductive metal film and also maintain the refractory metal silicide layer and the silicon substrate to have temperatures lower than the second temperature so as to prevent silicon from being diffused through the barrier metal layer into the conductive metal film.

100 Claims, 1 Drawing Sheet

METHOD OF BURYING A CONTACT HOLE WITH A METAL FOR FORMING MULTILEVEL INTERCONNECTIONS

BACKGROUND OF THE INVENTION

The present invention relates to a method of forming a semiconductor device, and more particularly to a method of burying contact holes with a metal for forming multilevel interconnections.

In recent years, requirements for a high density integration of a semiconductor device and multilevel interconnections have been on the increase whereby it is also required to reduce the width of internal interconnections. The reduction in width of the interconnections requires forming a contact hole of a high aspect ratio. In prior art, however, it was difficult to exactly bury the contact hole of a high aspect ratio with a metal without forming any void.

In order to settle the above problem, it was proposed to bury the contact hole with the metal as follows. First, a refractory metal film is formed over an insulation film with a contact hole already formed on a substrate for subsequent formations of a titanium nitride film and an aluminum alloy film over them before the substrate is heated up to a temperature of 300° C. for receipt of irradiation of a laser beam to thereby cause a reflow of the aluminum alloy so that the contact hole is buried with the aluminum alloy. It is also possible to prevent the aluminum alloy. This technique is disclosed in the Japanese laid-open patent publication No. 3-131029.

As described above, the substrate is heated up to a temperature of 300° C. for a laser beam irradiation thereonto. In this case, a barrier metal layer of titanium nitride is heated to a temperature of about 600° C. which is above a critical temperature of 500° C. over which a chemical reaction of aluminum alloy with nitrogen in titanium nitride for the barrier metal. As a result, an aluminum nitride film is formed, which is highly resistive, for which reason a highly resistive contact is formed.

There was proposed another technique which is disclosed in the Japanese laid-open patent publication No. 2-271634. In this technique, a substrate is heated up to a temperature of not less than 450° C. and below a melting point of aluminum or aluminum alloy so as to carry out a vacuum evaporation of aluminum or aluminum alloy onto a surface of the substrate whereby the contact hole is buried with the aluminum or aluminum alloy.

As described above, the substrate is heated up to a temperature of not less than 450° C. for vacuum evaporation. However, the growth rate is slow and it is difficult to obtain a uniformity in level of substrate surface. Further, there is a possibility of a diffusion of an interconnection material into a semiconductor region. It is furthermore difficult to obtain a strong adhesion between the semiconductor region and the insulation film.

There was proposed still another technique which is disclosed in the Japanese laid-open patent publication No. 62-123714. In this technique, a substrate with a rough surface has been placed in an atmosphere including a steam of an organic metal before the substrate is cooled down so as to cause the organic metal to be adhered onto the rough surface of the substrate. A light is irradiated onto a predetermined portion of the organic metal film covering the rough surface of the substrate so as to cause a decomposition of the organic metal for formation of a metal interconnection layer.

As described above, the light energy is used for causing the decomposition of the organic metal, for which reason a reflective light from an interior of the contact hole results in locally insufficient or locally excessive decomposition of the organic metal. It is, therefore, difficult to bury the contact hole of a high aspect ratio, for example, 3–4 with a metal uniformly.

In the above circumstances, it had been required to develop a novel method of burying a contact hole having a high aspect ratio of about 4 with aluminum or aluminum alloy without formation of any void.

It had also been required to develop a novel method of burying a contact hole having a high aspect ratio with aluminum or aluminum alloy without formation of any highly resistive film such as titanium nitride film.

It had also been required to develop a novel method of burying a contact hole having a high aspect ratio with aluminum or aluminum alloy to ensure a high conductivity of a semiconductor region of a semiconductor substrate.

It had also been required to develop a novel method of burying a contact hole having a high aspect ratio with aluminum or aluminum alloy without heating the semiconductor region of the substrate up to a temperature of over 450° C.

It had also been required to develop a novel method of burying a contact hole having a high aspect ratio with aluminum or aluminum alloy without causing any diffusion of an interconnection material into a semiconductor region of the substrate.

It had also been required to develop a novel method of burying a large number of contact holes, each of which has a high aspect ratio, with aluminum or aluminum alloy uniformly.

It had also been required to develop a novel method of burying a contact hole having a high aspect ratio to allow planarization of a surface of a lower level interconnection for realization of multilevel interconnections.

It had also been required to develop a novel method of burying a contact hole having a high aspect ratio to improve a reliability of electrode/interconnection processes for a device designed in accordance with the 0.25 $\mu$m design rule to obtain a highly reliable semiconductor device.

SUMMARY OF THE INVENTION

Accordingly, it is an object of the present invention to provide a novel method of burying a contact hole having a high aspect ratio of about 4 with aluminum or aluminum alloy without formation of any void.

It is a further object of the present invention to provide a novel method of burying a contact hole having a high aspect ratio with aluminum or aluminum alloy without formation of any highly resistive film such as titanium nitride film.

It is a still further object of the present invention to provide a novel method of burying a contact hole having a high aspect ratio with aluminum or aluminum alloy to ensure a high conductivity of a semiconductor region of a semiconductor substrate.

It is yet a further object of the present invention to provide a novel method of burying a contact hole having a high aspect ratio with aluminum or aluminum alloy without heating the semiconductor region of the substrate up to a temperature of over 450° C.

It is a furthermore object of the present invention to provide a novel method of burying a contact hole having a high aspect ratio with aluminum or aluminum alloy without causing any diffusion of an interconnection material into a semiconductor region of the substrate.

It is moreover object of the present invention to provide a novel method of burying a large number of contact holes, each of which has a high aspect ratio, with aluminum or aluminum alloy uniformly.

It is still more object of the present invention to provide a novel method of burying a contact hole having a high aspect ratio to allow planarization of a surface of a lower level interconnection for realization of multilevel interconnections.

It is another object of the present invention to provide a novel method of burying a contact hole having a high aspect ratio to improve a reliability of electrode/interconnection processes for a device designed in accordance with the 0.25 μm design rule to obtain a highly reliable semiconductor device.

The above and other objects, features and advantages of the present invention will be apparent from the following descriptions.

The first present invention provides a method of burying, with a conductive metal, a contact bole formed in an insulation film formed over a silicon substrate. Within the contact hole, a refractory metal silicide layer has been formed on the silicon substrate and a barrier metal layer has been formed on the refractory metal silicide layer and further a conductive metal film has been formed on the barrier metal layer. The method comprises the following step. A top surface region of the conductive metal film is rapidly heated up to a first temperature below a melting point of the conductive metal film but so high as to cause a semi-fluidization of only the top surface region of the conductive metal film so as to maintain an interface between the barrier metal layer and the conductive metal film at a second temperature which is lower than the first temperature and so low as to prevent any chemical reaction between the barrier metal layer and the conductive metal film and also maintain the refractory metal silicide layer and the silicon substrate to have temperatures lower than the second temperature so as to prevent silicon from being diffused through the barrier metal layer into the conductive metal film.

The second present invention provides a method of burying, with a conductive metal, a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending not only over the insulation film but also in the contact hole, The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. The substrate is cooled for subsequent heating a top surface region of the conductive metal film rapidly so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

The third present invention provides a method of burying, with a conductive metal a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending not only over the insulation film but also in the contact hole. The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. A top surface region of the conductive metal film is heated, during cooling a bottom surface of the substrate, so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

The fourth present invention provides a method of burying, with a conductive metal, a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending not only over the insulation film but also in the contact hole. The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film. An interface between the barrier metal layer and the conductive metal film has a second temperature which is lower than the first temperature and so low as to prevent any chemical reaction between the barrier metal layer and the conductive metal film. The refractory metal silicide layer and the silicon substrate are maintained to have temperatures lower than the second temperature so as to prevent silicon from being diffused through the barrier metal layer into the conductive metal film.

The fifth present invention provides a method of causing a reflow of a conductive metal film provided on a barrier metal layer extending over a refractory metal silicide layer having been formed on a silicon substrate. The method comprises the following steps. The substrate is cooled for subsequent heating a top surface region of the conductive metal film rapidly so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

The sixth present invention provides a method of causing a reflow of a conductive metal film provided on a barrier metal layer extending over a refractory metal silicide layer having been formed on a silicon substrate. The method comprises the following step. A top surface region of the conductive metal film is heated, during cooling a bottom surface of the substrate, so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

The seventh present invention provides a method of causing a reflow of a conductive metal film provided on a barrier metal layer extending over a refractory metal silicide layer having been formed on a silicon substrate. The method comprises the following step. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film. An interface between the barrier metal layer and the conductive metal film has a second temperature which is lower than the first temperature and so low as to prevent any chemical reaction between the barrier metal layer and the conductive metal film. The refractory metal silicide layer and the silicon substrate are maintained to have temperatures lower than the second temperature so as to prevent silicon from being diffused through the barrier metal layer into the conductive metal film.

The eighth present invention provides a method of causing a reflow of a conductive metal film provided on a barrier metal layer extending over a refractory metal silicide layer having been formed on a silicon substrate. The method comprises the following step. A gradient in temperature is caused across interfaces of the conductive metal film, the barrier metal layer and the refractory metal silicide layer so that the top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film and also that the refractory metal silicide layer and the silicon substrate have temperatures lower than the second temperature so as to prevent silicon from being diffused through the barrier metal layer into the conductive metal film.

The ninth present invention provides a method of causing a reflow of a conductive metal film provided on a refractory metal layer overlying a silicon substrate. The method comprises the following step. A gradient in temperature is caused across interfaces of the conductive metal film and the refractory metal layer so that a top surface region of the conductive metal film has a first temperature below a melting point of the conductive metal film but so high as to cause a semi-fluidization of only the top surface region of the conductive metal film whilst an interface between the refractory metal layer and the conductive metal film has a second temperature which is lower than the first temperature and so low as to prevent any chemical reaction between the refractory metal layer and the conductive metal film and also that the refractory metal layer and the silicon substrate have temperatures lower than the second temperature so as to prevent silicon from being diffused through the refractory metal layer into the conductive metal film.

The tenth present invention provides a method of causing a reflow of a conductive metal film extending over a refractory metal layer having been formed on a silicon substrate. The method comprises the following step. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film whilst an interface between the refractory metal layer and the conductive metal film has a second temperature which is lower than the first temperature and so low as to prevent any chemical reaction between the refractory metal layer and the conductive metal film and also that the refractory metal layer and the silicon substrate are maintained to have temperatures lower than the second temperature so as to prevent silicon from being diffused through the barrier metal layer into the conductive metal film.

BRIEF DESCRIPTIONS OF THE DRAWINGS

Preferred embodiments of the present invention will be described in detail with reference to the accompanying drawings.

DISCLOSURE OF THE INVENTION

Figure 1:
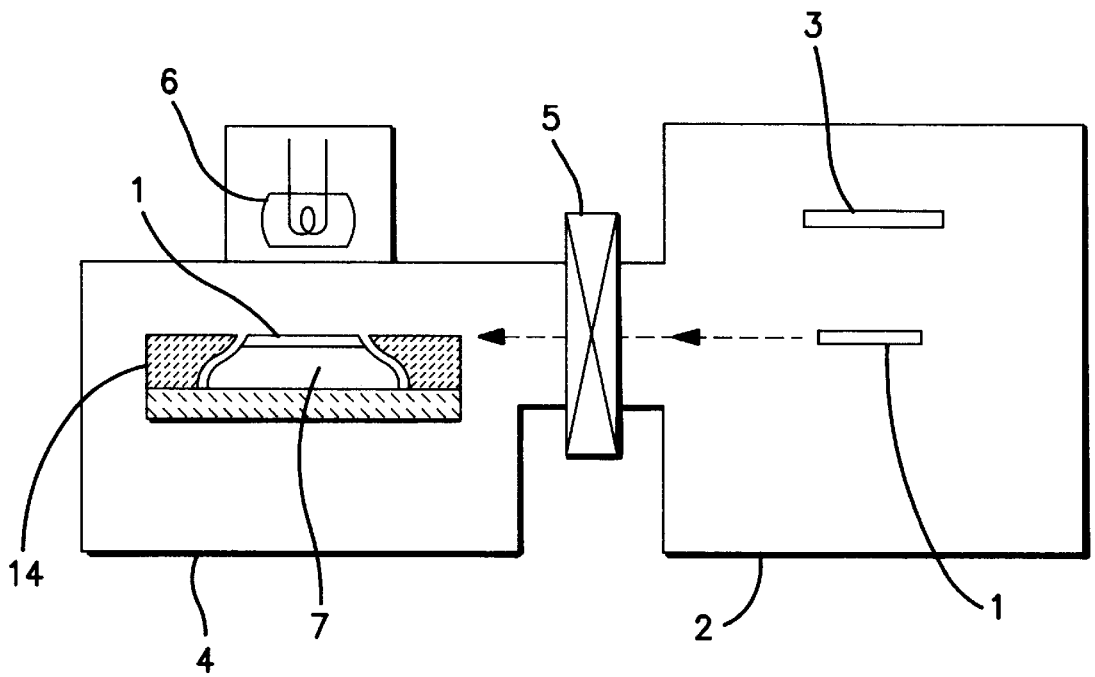
FIG. 1 is a schematic view illustrative of a sputtering and reflow system to be used for burying a contact hole with a metal in a first embodiment according to the present invention.

The first present invention provides a method of burying, with a conductive metal, a contact hole formed in an insulation film formed over a silicon substrate. Within the contact hole, a refractory metal silicide layer has been formed on the silicon substrate and a barrier metal layer has been formed on the refractory metal silicide layer and further a conductive metal film has been formed on the barrier metal layer. The method comprises the following step. A top surface region of the conductive metal film is rapidly heated up to a first temperature below a melting point of the conductive metal film but so high as to cause a semi-fluidization of only the top surface region of the conductive metal film so as to maintain an interface between the barrier metal layer and the conductive metal film at a second temperature which is lower than the first temperature and so low as to prevent any chemical reaction between the barrier metal layer and the conductive metal film and also maintain the refractory metal silicide layer and the silicon substrate to have temperatures lower than the second temperature so as to prevent silicon from being diffused through the barrier metal layer into the conductive metal film.

It is possible that following to cooling the substrate, the top surface region of the conductive metal film is rapidly heated up so as to cause a gradient in temperature across interfaces of the conductive metal film, the barrier metal layer and the refractory metal silicide layer.

Alternatively, it is possible that during cooling a bottom surface of the substrate, the top surface region of the conductive metal film is rapidly heated up so as to cause a gradient in temperature across interfaces of the conductive metal film, the barrier metal layer and the refractory metal silicide layer.

It is preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys. In this case, it is optionally possible that the said first temperature is in the range of 300° C.–500° C.

Alternatively, it is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The second present invention provides a method of burying, with a conductive metal, a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending riot only over the insulation film but also in the contact hole. The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. The substrate is cooled for subsequent heating a top surface region of the conductive metal film rapidly so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

A Peltier cooling system surrounded by a thermal shield is available to cool the substrate. A halogen lamp is available to heat the substrate.

It is preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys In this case, it is optionally preferable that the first temperature is in the range of 300° C.–500° C.

It is preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The third present invention provides a method of burying, with a conductive metal, a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending not only over the insulation film but also in the contact hole. The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. A top surface region of the conductive metal film is heated, during cooling a bottom surface of the substrate, so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

A Peltier cooling system surrounded by a thermal shield is available to cool the substrate. A halogen lamp is available to heat the substrate.

It is preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal suicide layer is made of one selected from the group consisting of titanium silicide and tantalum silicide.

It is also preferable that the barrier metal layer is made of one selected from the group consisting of titanium nitride and tantalum nitride.

The fourth present invention provides a method of burying, with a conductive metal, a contact hole formed in an insulation film formed over a silicon substrate. The method comprises the following steps. A refractory metal layer is formed not only over the insulation film but also on the silicon substrate shown via the contact hole. A barrier metal layer is formed on the refractory metal layer extending not only over the insulation film but also in the contact hole. The substrate is subjected to annealing to cause a silicidation reaction on an interface between the refractory metal layer and the silicon substrate under the contact hole to thereby form a refractory metal silicide layer over the silicon substrate and in the contact hole. A conductive metal film is formed over the barrier metal layer extending not only over the refractory metal silicide layer but also in the contact hole. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film. An interface between the barrier metal layer and the conductive metal film has a second temperature which is lower than the first temperature and so low as to prevent any chemical reaction between the barrier metal layer and the conductive metal film. The refractory metal silicide layer and the silicon substrate are maintained to have temperatures lower than the second temperature so as to prevent silicon from being diffused through the barrier metal layer into the conductive metal film.

It is preferable that the high density plasma is generated by applying a radio frequency voltage signal to an electrode which faces to the substrate. In this case, it is more preferable that the substrate is applied to a radio frequency voltage to attract, toward the substrate, metal ions having been generated when the high density plasma attacks to the surface of the metal layer.

It is also preferable that the second temperature is not more than 430° C.

It is also preferable that the silicon substrate is cooled during the top of the conductive metal layer is exposed to the high density plasma.

It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The fifth present invention provides a method of causing a reflow of a conductive metal film provided on a barrier metal layer extending over a refractory metal silicide layer having been formed on a silicon substrate. The method comprises the following steps. The substrate is cooled for subsequent heating a top surface region of the conductive metal film rapidly so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

A Peltier cooling system surrounded by a thermal shield is available to cool the substrate. A halogen lamp is available to heat the substrate.

It is preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The sixth present invention provides a method of causing a reflow of a conductive metal film provided on a barrier metal layer extending over a refractory metal silicide layer having been formed on a silicon substrate. The method comprises the following step. A top surface region of the conductive metal film is heated, during cooling a bottom surface of the substrate so as to cause a gradient in temperature across interfaces of the conductive metal film, the barrier metal layer and the refractory metal silicide layer. The top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film. The refractory metal silicide layer and the silicon substrate have temperatures lower than the second temperature so as to prevent silicon from being diffused through the barrier metal layer into the conductive metal film.

A Peltier cooling system surrounded by a thermal shield is available to cool the substrate. A halogen lamp is available to heat the substrate.

It is preferable that the second temperature is not more than 430° C.

It is also preferable that a difference of the second temperature from the first temperature is in the range of 30° C.–40° C. It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The seventh present invention provides a method of causing a reflow of a conductive metal film provided on a barrier metal layer extending over a refractory metal silicide layer having been formed on a silicon substrate. The method comprises the following step. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film. An interface between the barrier metal layer and the conductive metal film has a second temperature which is lower than the first temperature and so low as to prevent any chemical reaction between the barrier metal layer and the conductive metal film. The refractory metal silicide layer and the silicon substrate are maintained to have temperatures lower than the second temperature so as to prevent silicon from being diffused through the barrier metal layer into the conductive metal film.

It is preferable that the high density plasma is generated by applying a radio frequency voltage signal to an electrode which faces to the substrate. In this case, it is more preferable that the substrate is applied to a radio frequency voltage to attract, toward the substrate, metal ions having been generated when the high density plasma attacks to the surface of the metal layer.

It is preferable that the second temperature is not more than 430° C.

It is also preferable that the silicon substrate is cooled during the top of the conductive metal layer is exposed to the high density plasma.

It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The eighth present invention provides a method of causing a reflow of a conductive metal film provided on a barrier metal layer extending over a refractory metal silicide layer having been formed on a silicon substrate. The method comprises the following step. A gradient in temperature is caused across interfaces of the conductive metal film the barrier metal layer and the refractory metal silicide layer so that the top surface region of the conductive metal film has a first temperature below a melting point of the conductive metal film but so high as to cause a semi-fluidization of only the top surface region of the conductive metal film whilst an interface between the barrier metal layer and the conductive metal film has a second temperature which is lower than the first temperature and so low as to prevent any chemical reaction between the barrier metal layer and the conductive metal film and also that the refractory metal suicide layer and the silicon substrate have temperatures lower than the second temperature so as to prevent silicon from being diffused through the barrier metal layer into the conductive metal film.

It is preferable that, following to cooling the substrate, the top surface region of the conductive metal film is rapidly heated up so as to cause a gradient in temperature across interfaces of the conductive metal film, the barrier metal layer and the refractory metal silicide layer.

Alternatively, it is preferable that, wherein, during cooling a bottom surface of the substrate, the top surface region of the conductive metal film is rapidly heated up so as to cause a gradient in temperature across interfaces of the conductive metal film, the barrier metal layer and the refractory metal silicide layer.

It is preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys. In this case, it is optionally preferable that the first temperature is in the range of 300° C.–500° C.

It is also preferable that the metal layer is made of a metal selected from the group consisting of copper and copper alloys.

It is also preferable that the refractory metal silicide layer is made of one selected from the group consisting of titanium silicide and tantalum silicide.

It is also preferable that the barrier metal layer is made of one selected from the group consisting of titanium nitride and tantalum nitride.

The ninth present invention provides a method of causing a reflow of a conductive metal film provided on a refractory metal layer overlying a silicon substrate. The method comprises the following step. A gradient in temperature is caused across interfaces of the conductive metal film and the refractory metal layer so that a top surface region of the conductive metal film has a first temperature below a melting point of the conductive metal film but so high as to cause a semi-fluidization of only the top surface region of the conductive metal film whilst an interface between the refractory metal layer and the conductive metal film has a second temperature which is lower than the first temperature and so low as to prevent any chemical reaction between the refractory metal layer and the conductive metal film and also that the refractory metal layer and the silicon substrate have temperatures lower than the second temperature so as to prevent silicon from being diffused through the refractory metal layer into the conductive metal film.

It is preferred that following to cooling the substrate, the top surface region of the conductive metal film is rapidly heated up for such a short time as to cause a gradient in temperature across interfaces of the conductive metal film and the refractory metal layer.

It is also preferred that during cooling a bottom surface of the substrate, the top surface region of the conductive metal film is rapidly heated up for such a short time as to cause a gradient in temperature across interfaces of the conductive metal film and the refractory metal layer.

It is also preferred that the second temperature is not more than 430° C.

It is also preferred that a difference of the second temperature from the first temperature is in the range of 30° C.–40° C.

It is also preferred that the metal layer is made of a metal selected from the group consisting of aluminum and aluminum alloys.

It is also preferred that the first temperature is in the range of 300° C.–500° C.

It is also preferred that the metal layer is made of a metal selected from the group consisting of copper and copper alloys.

It is also preferred that the refractory metal layer is made of titanium.

It is also preferred that the refractory metal layer is made of tantalum.

The tenth present invention provides a method of causing a reflow of a conductive metal film extending over a refractory metal layer having been formed on a silicon substrate. The method comprises the following step. A top surface of the conductive metal film is exposed to a high density plasma to thereby heat the top surface of the conductive metal film up to a first temperature below a melting point of the conductive metal film but so high as to cause a semi-fluidization of only the top surface region of the conductive metal film whilst an interface between the refractory metal layer and the conductive metal film has a second temperature which is lower than the first temperature and so low as to prevent any chemical reaction between the refractory metal layer and the conductive metal film and also that the refractory metal layer and the silicon substrate are maintained to have temperatures lower than the second temperature so as to prevent silicon from being diffused through the barrier metal layer into the conductive metal film.

It is preferable that the high density plasma is generated by applying a radio frequency voltage signal to an electrode which faces to the substrate.

It is also preferable that the substrate is applied to a radio frequency voltage to attract, toward the substrate, metal ions having been generated when the high density plasma has attacked to the surface of the metal layer.

It is also preferable that the second temperature is not more than 430° C.

It is also preferable that a difference of the second temperature from the first temperature is in the range of 30° C.–40° C.

It is also preferable that the metal layer is made of a metal selected from the group consisting of aluminum and aluminum alloys.

It is also preferable that the first temperature is in the range of 300° C.–500° C.

It is also preferable that the metal layer is made of a metal selected from the group consisting of copper and copper alloys.

It is also preferable that the refractory metal layer is made of one selected from the group consisting of titanium silicide and tantalum silicide.

It is also preferable that the silicon substrate is cooled during exposure of the top surface of the conductive metal film to the high density plasma.

PREFERRED EMBODIMENTS

A first embodiment according to the present invention will be described in detail with reference to FIG. 1 which is illustrative of a sputtering and reflow system to be used for burying a contact hole with a metal.

The sputtering and reflow system has a sputter chamber 2 and a reflow chamber 4 which are separated from each other. The sputter chamber 2 and the reflow chamber 4 are allowed to be maintained in vacuum state in which a substrate 1 is movable from the sputter chamber 2 to the reflow chamber 4. A gate valve 5 is provided between the sputter chamber 2 to the reflow chamber 4 so that a reaction in the sputter chamber 2 is separated from a reaction in the reflow chamber 4.

In the sputter chamber 2, a silicon substrate 1 is placed to face to a target 3. In the reflow chamber 4, a Peltier cooling system 7 is provided which cools the substrate 1 by utilizing Peltier effect. The Peltier cooling system 7 is surrounded by a thermal shield 14. The substrate 1 has been moved from the sputter chamber 2 into the reflow chamber 4 and then placed on the Peltier cooling system 7 so that the bottom surface of the silicon substrate 1 is made into contact with the Peltier cooling system 7. On the other hand, a heater 6 is provided on the top surface or a main surface of the silicon substrate 1. The heater 6 may comprise either a normal heater which generates heat or a halogen lamp which projects a light onto the substrate 1. It is possible that the halogen lamp is provided outside the chamber 4 so as to project a light onto the substrate 1 from the exterior of the chamber 4.

On the top surface of the silicon substrate 1, a $p^+$-type diffusion layer is formed. A silicon oxide film is deposited on the $p^+$-type diffusion layer by a chemical vapor deposition. The silicon oxide film is etched to form contact holes of 0.25 micrometers in diameter and an aspect ratio of 4.

The above silicon substrate 1 is placed in the sputter chamber 2. A titanium film as a refractory metal film having a thickness of 200 angstroms is deposited at a room temperature on the top surface of the substrate 1 by sputtering the titanium target 3. The substrate 1 is heated up to a temperature of 200° C. so that a titanium nitride film as a barrier metal layer having a thickness of 1000 angstroms is formed on the titanium film. Subsequently, the substrate is heated by annealing at a temperature of about 790° C.–800° C. to cause a silicidation reaction on an interface between the titanium film and the silicon substrate 1 whereby a silicide film is formed over the silicon substrate 1. The annealing is carried out for a time so decided as to prevent a reaction of silicon with nitrogen or prevent the titanium silicide film from extending to the titanium nitride barrier metal layer. An aluminum alloy metal film having a thickness of 1 micrometer is formed by sputtering method at a substrate temperature in the range of 20° C.–100° C., wherein the aluminum alloy metal film may be made of., for example, Al—Si alloy metal including 1% by weight of Si or Al—Si—Cu alloy metal including 1% by weight of Si and 0.5% by weight of Cu.

The substrate 1 is then moved, without exposure to an atmosphere, from the sputtering chamber 2 into the reflow chamber 4. The reflow chamber 4 is separated by the gate valve 5 from the sputtering chamber 2 to prevent any interference between them except when the substrate 1 is moved from the sputtering chamber 2 into the reflow chamber 4. The substrate 1 is then placed on the Peltier cooling system 7, wherein the bottom surface of the silicon substrate 1 is made into contact with the Peltier cooling system 7. The bottom surface of the silicon substrate 1 has been cooled down to a temperature of—100° C. before the top surface of the aluminum alloy metal film over the titanium nitride barrier metal layer is heated by the heater 6 such as halogen lump up to a temperature of, for example, 460° C. which is, however, below a melting point of the aluminum alloy metal in order to cause a semi-fluidization or a reflow of aluminum alloy metal on the surface region of the aluminum alloy metal film. As a result, the surface region of the aluminum alloy metal film flows into the contact hole whereby the contact hole of the aspect ratio of 4 is completely buried with the aluminum alloy metal without any void or cavity. During the above reflow of the aluminum alloy metal film, an interface between the aluminum alloy metal film and the titanium nitride barrier layer is maintained by the Peltier cooling system 7 at a temperature lower by 30–40° C. than the temperature of the top surface of the aluminum alloy metal film so as to prevent any chemical reaction of aluminum with nitrogen on the interface between the aluminum alloy metal film and the titanium nitride barrier metal layer as well as prevent any diffusion of silicon into the aluminum alloy metal film and also diffusion of aluminum into the titanium silicide layer. It is essential that, during the heating up of the aluminum alloy metal film, the silicon substrate 1 is cooled to prevent any diffusion of nitrogen from the titanium nitride barrier metal film into the aluminum alloy metal film or avoid any chemical reaction of aluminum with nitrogen for the purpose of prevention of the formation of any aluminum nitride film which is highly resistive. It is preferable that the substrate 1 has previously been cooled down sufficiently before a heater such as halogen lump is used to rapidly heat up the aluminum alloy metal film for a short time in order to cause the reflow of at least an upper region of the aluminum alloy metal film but prevent heating up the silicon substrate 1.

According to the present invention, it is essential to cause a large gradient in temperature across interfaces of the aluminum alloy metal film, the titanium nitride barrier metal film, the titanium silicide layer and the silicon substrate 1 so that the surface region of the aluminum alloy metal film has such a high temperature as to cause a semi-fluidization of aluminum alloy metal whilst the interface between the aluminum alloy metal film and the titanium nitride barrier metal layer has such a low temperature as to prevent any reaction of aluminum and nitrogen. Further, the titanium silicide layer and the silicon substrate 1 have such low temperatures as to prevent silicon from being diffused through the titanium nitride barrier metal layer into the aluminum alloy metal film.

According to the first embodiment of the present invention, the contact hole having a high aspect ratio of 4 is completely buried with aluminum alloy metal with formation of no void nor highly resistive titanium nitride film. This allows planarization of a surface of a lower level interconnection for realization of multilevel interconnections, resulting in an improvement in reliability of electrode/interconnection processes for a device designed in accordance with the 0.25 µm design rule to obtain a highly reliable semiconductor device.

As modifications, in place of the Peltier cooling system, any other cooling system or any heat absorption system may be available. In place of halogen lamp, any other heater is available but capable of rapidly heating the top surface of the substrate. In place of aluminum or aluminum alloys, other aluminium alloy such as AlGe or copper and copper alloys are also available as a metal film to be reflowed into the contact hole. In place of titanium, any other refractory metal is available such as tungsten.

Figure 2:
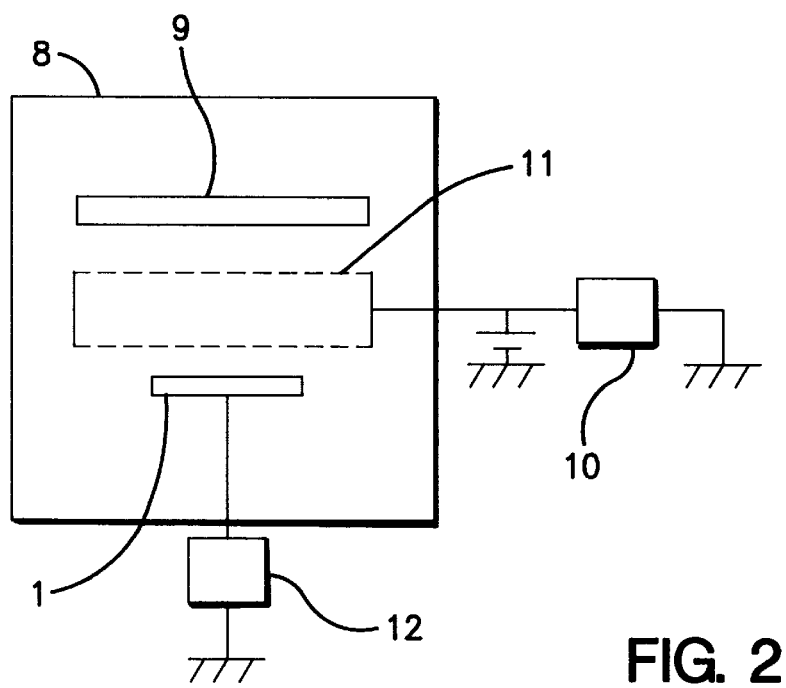
FIG. 2 is a schematic view illustrative of a sputtering system to be used for burying a contact hole with a metal in a second embodiment according to the present invention.

A second embodiment according to the present invention will be described in detail with reference to FIG. 2 which is a schematic view illustrative of a sputtering system to be used for burying a contact hole with a metal.

The sputtering system has a sputtering chamber 8 in which a target 9 and a stripe electrode 11 are provided. In the sputtering chamber 8, a silicon substrate 1 is placed to face to the target 9 so that the stripe electrode 11 is positioned between the silicon substrate 1 and the target 9. The stripe electrode 11 is connected to a first radio frequency power supply 10 so that radio frequency signals are applied to the stripe electrode 11, wherein the stripe electrode 11 acts as an anode. Further, a second radio frequency power supply 12 is provided which is connected to the silicon substrate 1 so that a radio frequency bias is applied to the silicon substrate 1. The radio frequency signals applied to the stripe electrode 11 causes the density of plasma to be increased so that a high density plasma attacks to the surface of the silicon substrate 1. As a result, only a top surface region of the silicon substrate 1 is heated up by the high density plasma whereby a temperature of the top surface region of the silicon substrate 1 is resin up to about 450° C. whilst the bottom surface of the silicon substrate 1 has a lower temperature by not less than 50° C. as compared to the temperature of the top surface region of the silicon substrate 1. Namely, the bottom surface of the silicon substrate 1 is maintained at a low temperature of not more than 400° C. Further, as described above, the radio Frequency bias is applied by the second radio frequency power supply 12 to the silicon substrate 1 to suppress reduction of the growth rate of the plasma sputtering deposition.

On the top surface of the silicon substrate 1, a $p^+$-type diffusion layer is formed. A silicon oxide film is deposited on the $p^+$-type diffusion layer by a chemical vapor deposition. The silicon oxide film is etched to form contact holes of 0.25 micrometers in diameter and an aspect ratio of 4.

The above silicon substrate 1 is then placed in the sputter chamber 2. A titanium film as a refractory metal film having a thickness of 200 angstroms is deposited at a room temperature on the top surface of the substrate 1 by sputtering the titanium target 9. The substrate 1 is heated up to a temperature of 200° C. so that a titanium nitride film as a barrier metal layer having a thickness of 1000 angstroms is formed on the titanium film. Subsequently, the substrate is heated by annealing at a temperature of about 790° C.–800° C. to cause a silicidation reaction on an interface between the titanium film and the silicon substrate 1 whereby a silicide film is formed over the silicon substrate 1. The annealing is carried out for a time so decided as to prevent a reaction of silicon with nitrogen or prevent the titanium silicide film from extending to the titanium nitride barrier metal layer. An aluminum alloy metal film having a thickness of 1 micrometer is formed by sputtering method at a substrate temperature in the range of 20° C.–100° C., wherein the aluminum alloy metal film may be made of, for example, Al—Si alloy metal including 1% by weight of Si or Al—Si—Cu alloy metal including 1% by weight of Si and 0.5% by weight of Cu.

Subsequently, a radio frequency voltage is applied by the first radio frequency power supply 10 to the stripe electrode 11 to generate a high density plasma so that the high density plasma attacks to the top surface of the aluminum alloy metal film whereby the top surface of the aluminum alloy metal film over the titanium nitride barrier metal layer is heated up to a temperature of, for example, 460° C. which is, however, below a melting point of the aluminum alloy metal in order to cause a semi-fluidization or a reflow of aluminum alloy metal on the surface region of the aluminum alloy metal film. As a result, the surface region of the aluminum alloy metal film flows into the contact hole whereby the contact hole of the aspect ratio of 4 is completely buried with the aluminum alloy metal without any void or cavity. During the above reflow of the aluminum alloy metal film, an interface between the aluminum alloy metal film and the titanium nitride barrier layer is maintained at a temperature in the range of 420° C.–430° C. which is lower than the temperature of the top surface of the aluminum alloy metal film so as to prevent any chemical reaction of aluminum with nitrogen on the interface between the aluminum alloy metal film and the titanium nitride barrier metal layer as well as prevent any diffusion of silicon into the aluminum alloy metal film and also diffusion of aluminum into the titanium silicide layer. It is essential that the high density plasma is made attack to the top surface of the aluminum alloy metal film for heating up only the top surface of the aluminum alloy metal film and maintaining the interface between the aluminum alloy metal film and the titanium nitride barrier metal layer at a low temperature in the range of 420° C.–430° C. so as to prevent any diffusion of nitrogen from the titanium nitride barrier metal film into the aluminum alloy metal film or avoid any chemical reaction of aluminum with nitrogen for the purpose of prevention of the formation of any aluminum nitride film which is highly resistive. It is preferable that the substrate 1 is applied with the radio frequency voltage to attract, toward the substrate 1, aluminum ions having been generated by the high density plasma made attack onto the top surface of the aluminum alloy metal film. The substrate 1 is exposed to the high density plasma for a short time in order to cause the reflow of at least an upper region of the aluminum alloy metal film but prevent heating up the silicon substrate 1. According to the present invention, it is essential to cause a large gradient in temperature across interfaces of the aluminum alloy metal film, the titanium nitride barrier metal film, the titanium silicide layer and the silicon substrate 1 so that the surface region of the aluminum alloy metal film has such a high temperature as to cause a semi-fluidization of aluminum alloy metal whilst the interface between the aluminum alloy metal film and the titanium nitride barrier metal layer has such a low temperature as to prevent any reaction of aluminum and nitrogen. Further, the titanium silicide layer and the silicon substrate 1 have such lower temperatures as to prevent silicon from being diffused through the titanium nitride barrier metal layer into the aluminum alloy metal film.

According to the second embodiment of the present invention, the contact hole having a high aspect ratio of 4 is completely buried with aluminum alloy metal with formation of no void nor highly resistive titanium nitride film. This allows planarization of a surface of a lower level interconnection for realization of multilevel interconnections, resulting in an improvement in reliability of electrode/interconnection processes for a device designed in accordance with the 0.25 μm design rule to obtain a highly reliable semiconductor device.

As modifications, in place of aluminum or aluminum alloys, other aluminum alloy such as AlGe or copper and copper alloys are also available as a metal film to be reflowed into the contact hole. In place of titanium, any either refractory metal is available such as tungsten.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of burying, with a conductive metal, and contact hole formed in an insulation film formed over a silicon substrate, wherein within said contact hole, a refractory metal silicide layer has been formed on said silicon substrate and a barrier metal layer has been formed on said refractory metal silicide layer and further a conductive metal film has been formed on said barrier metal layer, said method comprising the steps of:

rapidly heating a top surface region of said conductive metal film to a first temperature below a melting point of said conductive metal film and high enough so as to cause a semi-fluidization of only said top surface region of said conductive metal film, maintaining an interface between said barrier metal layer and said conductive metal film at a second temperature which is lower than said first temperature and low enough so as to prevent any chemical reaction between said barrier metal layer and said conductive metal film, and maintaining said refractory metal silicide layer and said silicon substrate at temperatures lower than said second temperature so as to prevent silicon from being diffused through said barrier metal layer into said conductive metal film by cooling said substrate.

2. The method as claimed in claim 1, wherein, following to cooling said substrate, said top surface region of said conductive metal film is rapidly heated up for such a short time as to cause a gradient in temperature across interfaces of said conductive metal film, said barrier metal layer and said refractory metal silicide layer.

3. The method as claimed in claim 1, wherein, during cooling a bottom surface of said substrate, said top surface region of said conductive metal film is rapidly heated up for such a short time as to cause a gradient in temperature across interfaces of said conductive metal film, said barrier metal layer and said refractory metal silicide layer.

4. The method as claimed in claim 1, wherein said second temperature is not more than 430° C.

5. The method as claimed in claim 1, wherein a difference of said second temperature from said first temperature is in the range of 30° C.–40° C.

6. The method as claimed in claim 1, wherein said metal layer is made of a metal selected from the group consisting of aluminum and aluminum alloys.

7. The method as claimed in claim 6, wherein said first temperature is in the range of 300° C.–500° C.

8. The method as claimed in claim 1, wherein said metal layer is made of a metal selected from the group consisting of copper and copper alloys.

9. The method as claimed in claim 1, wherein said refractory metal silicide layer is made of one selected from the group consisting of titanium silicide and tantalum silicide.

10. The method as claimed in claim 1, wherein said barrier metal layer is made of one selected from the group consisting of titanium nitride and tantalum nitride.

11. A method of burying, with a conductive metal, a contact hole formed in an insulation film formed over a silicon substrate, said method comprising the steps of:

forming a refractory metal layer not only over said insulation film but also on said silicon substrate exposed via said contact hole;

forming a barrier metal layer on said refractory metal layer extending not only over said insulation film but also in said contact hole;

subjecting said substrate to annealing to cause a silicidation reaction on an interface between said refractory metal layer and said silicon substrate under said contact hole to thereby form a refractory metal silicide layer over said silicon substrate and in said contact hole;

forming a conductive metal film over said barrier metal layer extending not only over said refractory metal silicide layer but also in said contact hole;

after said step of forming a conductive film, cooling said substrate and subsequently heating a top surface region of said conductive metal film rapidly so as to cause a gradient in temperature across interfaces of said conductive metal film, said barrier metal layer and said refractory metal silicide layer so that said top surface region of said conductive metal film has a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also that said refractory metal silicide layer and said silicon substrate have temperatures lower than said second temperature so as to prevent silicon from being diffused through said barrier metal layer into said conductive metal film.

12. The method as claimed in claim 11, wherein said substrate is cooled by a Peltier cooling system surrounded by a thermal shield.

13. The method as claimed in claim 11, wherein said substrate is heated by use of a halogen lamp.

14. The method as claimed in claim 11, wherein said second temperature is not more than 430° C.

15. The method as claimed in claim 11, wherein a difference of said second temperature from said first temperature is in the range of 30° C.–40° C.

16. The method as claimed in claim 11, wherein said metal layer is made of a metal selected from the group consisting of aluminum and aluminum alloys.

17. The method as claimed in claim 16, wherein said first temperature is in the range of 300° C.–500° C.

18. The method as claimed in claim 11, wherein said metal layer is made of a metal selected from the group consisting of copper and copper alloys.

19. The method as claimed in claim 11, wherein said refractory metal silicide layer is made of one selected from the group consisting of titanium silicide and tantalum silicide.

20. The method as claimed in claim 11, wherein said barrier metal layer is made of one selected from the group consisting of titanium nitride and tantalum nitride.

21. A method of burying, with a conductive metal, a contact hole formed in an insulation film formed over a silicon substrate, said method comprising the steps of:

forming a refractory metal layer not only over said insulation film but also on said silicon substrate exposed via said contact hole;

forming a barrier metal layer on said refractory metal layer extending not only over said insulation film but also in said contact hole;

subjecting said substrate to annealing to cause a silicidation reaction on an interface between said refractory metal layer and said silicon substrate under said contact hole to thereby form a refractory metal silicide layer over said silicon substrate and in said contact hole;

forming a conductive metal film over said barrier metal layer extending not, only over said refractory metal silicide layer but also in said contact hole; and subsequently to said forming a conductive metal step, heating a top surface region of said conductive metal film, during cooling a bottom surface of said substrate so as to cause a gradient in temperature across interfaces of said conductive metal film, said barrier metal layer and said refractory metal silicide layer so that said top surface region of said conductive metal film has a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also that said refractory metal silicide layer and said silicon substrate have temperatures lower than said second temperature so as to prevent silicon from being diffused through said barrier metal layer into said conductive metal film.

22. The method as claimed in claim 21, wherein said substrate is cooled by a Peltier cooling system surrounded by a thermal shield.

23. The method as claimed in claim 21, wherein said substrate is heated by use of a halogen lamp.

24. The method as claimed in claim 21, wherein said second temperature is not more than 430° C.

25. The method as claimed in claim 21, wherein a difference of said second temperature from said first temperature is in the range of 30° C.–40° C.

26. The method as claimed in claim 21, wherein said metal layer is made of a metal selected from the group consisting of aluminum and aluminum alloys.

27. The method as claimed in claim 26, wherein said first temperature is in the range of 300° C.–500° C.

28. The method as claimed in claim 21, wherein said metal layer is made of a metal selected from the group consisting of copper and copper alloys.

29. The method as claimed in claim 21, wherein said refractory metal silicide layer is made of one selected from the group consisting of titanium silicide and tantalum silicide.

30. The method as claimed in claim 21, wherein said barrier metal layer is made of one selected from the group consisting of titanium nitride and tantalum nitride.

31. A method of burying, with a conductive metal, a contact hole formed in an insulation film formed over a silicon substrate, said method comprising the steps of:

forming a refractory metal layer not only over said insulation film but also on said silicon substrate exposed via said contact hole;

forming a barrier metal layer on said refractory metal layer extending not only over said insulation film but also in said contact hole;

subjecting said substrate to annealing to cause a silicidation reaction on an interface between said refractory metal layer and said silicon substrate under said contact hole to thereby form a refractory metal silicide layer over said silicon substrate and in said contact hole;

forming a conductive metal film over said barrier metal layer extending not only over said refractory metal silicide layer but also in said contact hole; and subsequent to said step of forming a conductive film, exposing a top surface of said conductive metal film to a high density plasma to thereby heat said top surface of said conductive metal film up to a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also said refractory metal silicide layer and said silicon substrate are maintained to have temperatures lower than said second temperature so as to prevent silicon from being diffused through said barrier metal layer into said conductive metal film.

32. The method as claimed in claim 31, wherein said high density plasma is generated by applying a radio frequency voltage signal to an electrode which faces to said substrate.

33. The method as claimed in claim 32, wherein said substrate is applied to a radio frequency voltage to attract, toward said substrate, metal ions having been generated when said high density plasma has attacked to said surface of said metal layer.

34. The method as claimed in claim 31, wherein said second temperature is not more than 430° C.

35. The method as claimed in claim 31, wherein said silicon substrate is cooled during said top of said conductive metal layer is exposed to said high density plasma.

36. The method as claimed in claim 31, wherein said metal layer is made of a metal selected from the group consisting of aluminum and aluminum alloys.

37. The method as claimed in claim 36, wherein said first temperature is in the range of 300° C.–500° C.

38. The method as claimed in claim 31, wherein said metal layer is made of a metal selected from the group consisting of copper and copper alloys.

39. The method as claimed in claim 31, wherein said refractory metal silicide layer is made of one selected from the group consisting of titanium silicide and tantalum silicide.

40. The method as claimed in claim 31, wherein said barrier metal layer is made of one selected from the group consisting of titanium nitride and tantalum nitride.

41. A method of causing a reflow of a conductive metal film provided on a barrier metal layer extending over a refractory metal silicide layer having been formed on a silicon substrate, said method comprising the steps of:

cooling said substrate and subsequently heating a top surface region of said conductive metal film rapidly so as to cause a gradient in temperature across interfaces of said conductive metal film, said barrier metal layer and said refractory metal silicide layer so that said top surface region of said conductive metal film has a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also that said refractory metal silicide layer and said silicon substrate have temperatures lower than said second temperature so as to prevent silicon from being diffused through said barrier metal layer into said conductive metal film.

42. The method as claimed in claim 41, wherein said substrate is cooled by a Peltier cooling system surrounded by a thermal shield.

43. The method as claimed in claim 41, wherein said substrate is heated by use of a halogen lamp.

44. The method as claimed in claim 41, wherein said second temperature is not more than 430° C.

45. The method as claimed in claim 41, wherein a difference of said second temperature from said first temperature is in the range of 30° C.–40° C.

46. The method as claimed in claim 41, wherein said metal layer is made of a metal selected from the group consisting of aluminum and aluminum alloys.

47. The method as claimed in claim 46, wherein said first temperature is in the range of 300° C.–500° C.

48. The method as claimed in claim 41, wherein said metal layer is made of a metal selected from the group consisting of copper and copper alloys.

49. The method as claimed in claim 41, wherein said refractory metal silicide layer is made of one selected from the group consisting of titanium silicide and tantalum silicide.

50. The method as claimed in claim 41, wherein said barrier metal layer is made of one selected from the group consisting of titanium nitride and tantalum nitride.

51. A method of causing a reflow of a conductive metal film provided on a barrier metal layer extending over a refractory metal silicide layer having been formed on a silicon substrate, said method comprising the step of:

heating a top surface region of said conductive metal film while simultaneously cooling a bottom surface of said substrate so as to cause a gradient in temperature across interfaces of said conductive metal film, said barrier metal layer and said refractory metal silicide layer so that said top surface region of said conductive metal film has a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also that said refractory metal silicide layer and said silicon substrate have temperatures lower than said second temperature so as to prevent silicon from being diffused through said barrier metal layer into said conductive metal film.

52. The method as claimed in claim 51, wherein said substrate is cooled by a Peltier cooling system surrounded by a thermal shield.

53. The method as claimed in claim 51, wherein said substrate is heated by use of a halogen lamp.

54. The method as claimed in claim 51, wherein said second temperature is not more than 430° C.

55. The method as claimed in claim 51, wherein a difference of said second temperature from said first temperature is in the range of 30° C.–40° C.

56. The method as claimed in claim 51, wherein said metal layer is made of a metal selected from the group consisting of aluminum and aluminum alloys.

57. The method as claimed in claim 56, wherein said first temperature is in the range of 300° C.–500° C.

58. The method as claimed in claim 51, wherein said metal layer is made of a metal selected from the group consisting of copper and copper alloys.

59. The method as claimed in claim 51, wherein said refractory metal silicide layer is made of one selected from the group consisting of titanium silicide and tantalum silicide.

60. The method as claimed in claim 51, wherein said barrier metal layer is made of one selected from the group consisting of titanium nitride and tantalum nitride.

61. A method of causing a reflow of a conductive metal film provided on a barrier metal layer extending over a refractory metal silicide layer having been formed on a silicon substrate, said method comprising the step of:

exposing a top surface of said conductive metal film to a high density plasma to thereby heat said top surface of said conductive metal film up to a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also said refractory metal silicide layer and said silicon substrate are maintained to have temperatures lower than said second temperature so as to prevent silicon from being diffused through said barrier metal layer into said conductive metal film by cooling said substrate.

62. The method as claimed in claim 61, wherein said high density plasma is generated by applying a radio frequency voltage signal to an electrode which faces to said substrate.

63. The method as claimed in claim 62, wherein said substrate is applied to a radio frequency voltage to attract, toward said substrate, metal ions having been generated when said high density plasma has attacked to said surface of said metal layer.

64. The method as claimed in claim 61, wherein said second temperature is not more than 430° C.

65. The method as claimed in claim 61, wherein said silicon substrate is cooled during said top of said conductive metal layer is exposed to said high density plasma.

66. The method as claimed in claim 61, wherein said metal layer is made of a metal selected from the group consisting of aluminum and aluminum alloys.

67. The method as claimed in claim 66, wherein said first temperature is in the range of 300° C.–500° C.

68. The method as claimed in claim 61, wherein said metal layer is made of a metal selected from the group consisting of copper and copper alloys.

69. The method as claimed in claim 61, wherein said refractory metal silicide layer is made of one selected from the group consisting of titanium silicide and tantalum silicide.

70. The method as claimed in claim 61, wherein said barrier metal layer is made of one selected from the group consisting of titanium nitride and tantalum nitride.

71. A method of causing a reflow of a conductive metal film provided on a barrier metal layer extending over a refractory metal silicide layer having been formed on a silicon substrate, said method comprising the step of:

causing a gradient in temperature across interfaces of said conductive metal film, said barrier metal layer and said refractory metal silicide layer so that said top surface region of said conductive metal film has a first temperature below a melting point of said conductive metal film and high enough so as to cause a semi-fluidization of only said top surface region of said conductive metal film whilst an interface between said barrier metal layer and said conductive metal film has a second temperature which is lower than said first temperature and low enough so as to prevent any chemical reaction between said barrier metal layer and said conductive metal film and also that said refractory metal silicide layer and said silicon substrate have temperatures lower than said second temperature so as to prevent silicon from being diffused through said barrier metal layer into said conductive metal film by cooling said substrate.

72. The method as claimed in claim 71, wherein, following to cooling said substrate, said top surface region of said conductive metal film is rapidly heated up for such a short time as to cause a gradient in temperature across interfaces of said conductive metal film, said barrier metal layer and said refractory metal silicide layer.

73. The method as claimed in claim 71, wherein, during cooling a bottom surface of said substrate, said top surface region of said conductive metal film is rapidly heated up for such a short time as to cause a gradient in temperature across interfaces of said conductive metal film, said barrier metal layer and said refractory metal silicide layer.

74. The method as claimed in claim 71, wherein said second temperature is not more than 430° C.

75. The method as claimed in claim 71, wherein a difference of said second temperature from said first temperature is in the range of 30° C.–40° C.

76. The method as claimed in claim 71, wherein said metal layer is made of a metal selected from the group consisting of aluminum and aluminum alloys.

77. The method as claimed in claim 76, wherein said first temperature is in the range of 300° C.–500° C.

78. The method as claimed in claim 71, wherein said metal layer is made of a metal selected from the group consisting of copper and copper alloys.

79. The method as claimed in claim 71, wherein said refractory metal silicide layer is a titanium silicide layer.

80. The method as claimed in claim 71, wherein said barrier metal layer is made of one selected from the group consisting of titanium nitride and tantalum nitride.

81. A method of causing a reflow of a conductive metal film provided on a refractory metal layer overlying a silicon substrate, said method comprising the step of:

causing a gradient in temperature across interfaces of said conductive metal film and said refractory metal layer so that a top surface region of said conductive metal film has a first temperature below a melting point of said conductive metal film and also so high as to cause a semi-fluidization of only said top surface region of said conductive metal film whilst an interface between said refractory metal layer and said conductive metal film has a second temperature which is lower than said first temperature and low enough so as to prevent any chemical reaction between said refractory metal layer and said conductive metal film and also that said refractory metal layer and said silicon substrate have temperatures lower than said second temperature so as to prevent silicon from being diffused through said refractory metal layer into said conductive metal film by cooling said substrate.

82. The method as claimed in claim 81, wherein, following to cooling said substrate, said top surface region of said conductive metal film is rapidly heated up for such a short time as to cause a gradient in temperature across interfaces of said conductive metal film and said refractory metal layer.

83. The method as claimed in claim 81, wherein, during cooling a bottom surface of said substrate, said top surface region of said conductive metal film is rapidly heated up for such a short time as to cause a gradient in temperature across interfaces of said conductive metal film and said refractory metal layer.

84. The method as claimed in claim 81, wherein said second temperature is not more than 430° C.

85. The method as claimed in claim 81, wherein a difference of said second temperature from said first temperature is in the range of 30° C.–40° C.

86. The method as claimed in claim 81, wherein said metal layer is made of a metal selected from the group consisting of aluminum and aluminum alloys.

87. The method as claimed in claim 86, wherein said first temperature is in the range of 300° C.–500° C.

88. The method as claimed in claim 81, wherein said metal layer is made of a metal selected from the group consisting of copper and copper alloys.

89. The method as claimed in claim 81, wherein said refractory metal layer is made of titanium.

90. The method as claimed in claim 81, wherein said refractory metal layer is made of tantalum.

91. A method of causing a reflow of a conductive metal film extending over a refractory metal layer having been formed on a silicon substrate, said method comprising the step of:

exposing a top surface of said conductive metal film to a high density plasma to thereby heat said top surface of said conductive metal film up to a first temperature below a melting point of said conductive metal film but also high enough to cause a semi-fluidization of only said top surface region of said conductive metal film whilst an interface between said refractory metal layer and said conductive metal film has a second temperature which is lower than said first temperature and low enough so as to prevent any chemical reaction between said refractory metal layer and said conductive metal film and also that said refractory metal layer and said silicon substrate are maintained to have temperatures lower than said second temperature so as to prevent silicon from being diffused through said barrier metal layer into said conductive metal film.

92. The method as claimed in claim 91, wherein said high density plasma is generated by applying a radio frequency voltage signal to an electrode which faces to said substrate.

93. The method as claimed in claim 92, wherein said substrate is applied to a radio frequency voltage to attract, toward said substrate, metal ions having been generated when said high density plasma has attacked to said surface of said metal layer.

94. The method as claimed in claim 91, wherein said second temperature is not more than 430° C.

95. The method as claimed in claim 91, wherein a difference of said second temperature from said first temperature is in the range of 30° C.–40° C.

96. The method as claimed in claim 91, wherein said metal layer is made of a metal selected from the group consisting of aluminum and aluminum alloys.

97. The method as claimed in claim 96, wherein said first temperature is in the range of 300° C.–500° C.

98. The method as claimed in claim 91, wherein said metal layer is made of a metal selected from the group consisting of copper and copper alloys.

99. The method as claimed in claim 91, wherein said refractory metal layer is made of one selected from the group consisting of titanium silicide and tantalum silicide.

100. The method as claimed in claim 91, wherein said silicon substrate is cooled during exposure of said top surface of said conductive metal film to said high density plasma.

* * * * *